United States Patent
Bansal et al.

(10) Patent No.: US 11,005,368 B2
(45) Date of Patent: May 11, 2021

(54) HYSTERETIC WINDOW ADJUSTMENT OF TRI-LEVEL SWITCHING REGULATOR

(71) Applicant: QUALCOMM Incorporated, San Diego, CA (US)

(72) Inventors: Mukesh Bansal, San Diego, CA (US); Pengfei Li, San Diego, CA (US); Moataz Abdelsamie Abdelfattah, San Diego, CA (US); Iulian Mirea, San Diego, CA (US); Song Shi, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 0 days.

(21) Appl. No.: 16/573,825

(22) Filed: Sep. 17, 2019

(65) Prior Publication Data

US 2021/0083576 A1    Mar. 18, 2021

(51) Int. Cl.
| | |
|---|---|
| *H02M 3/158* | (2006.01) |
| *H03K 3/037* | (2006.01) |
| *H04B 7/185* | (2006.01) |
| *H04W 88/08* | (2009.01) |
| *H03F 3/20* | (2006.01) |

(52) U.S. Cl.
CPC ........ *H02M 3/158* (2013.01); *H03K 3/0377* (2013.01); *H03F 3/20* (2013.01); *H03F 2200/451* (2013.01); *H04B 7/185* (2013.01); *H04W 88/08* (2013.01)

(58) Field of Classification Search
CPC ....... H02M 3/158; H02M 3/0377; H03F 3/20; H03F 2200/451; H04B 7/185; H04W 88/08
See application file for complete search history.

(56) References Cited

U.S. PATENT DOCUMENTS

| | | | |
|---|---|---|---|
| 9,450,490 B2 * | 9/2016 | Cavallini | H05B 45/38 |
| 9,819,264 B1 * | 11/2017 | Boezen | H05B 45/37 |
| 10,107,841 B2 * | 10/2018 | Tasevski | G01R 19/04 |
| 10,171,101 B1 * | 1/2019 | Gupta | H03K 5/24 |
| 2010/0320935 A1 * | 12/2010 | Wibben | H05B 45/50 |
| | | | 315/294 |
| 2017/0023621 A1 * | 1/2017 | Tasevski | G01R 19/04 |
| 2020/0141993 A1 * | 5/2020 | Nikic | G03G 13/025 |

* cited by examiner

*Primary Examiner* — Adolf D Berhane
(74) *Attorney, Agent, or Firm* — Seyfarth Shaw LLP

(57) ABSTRACT

A method for unbalancing a tri-level switching regulator uses hysteretic control when switching across multiple states of the tri-level switching regulator. The method includes determining a battery voltage and an output voltage of the tri-level switching regulator. The method also includes dynamically adjusting at least one of a first hysteretic window of a first hysteretic comparator associated with a second switching state of the tri-level switching regulator and a second hysteretic window of a second hysteretic comparator associated with a first switching state of the tri-level switching regulator based on the battery voltage and the output voltage.

22 Claims, 11 Drawing Sheets

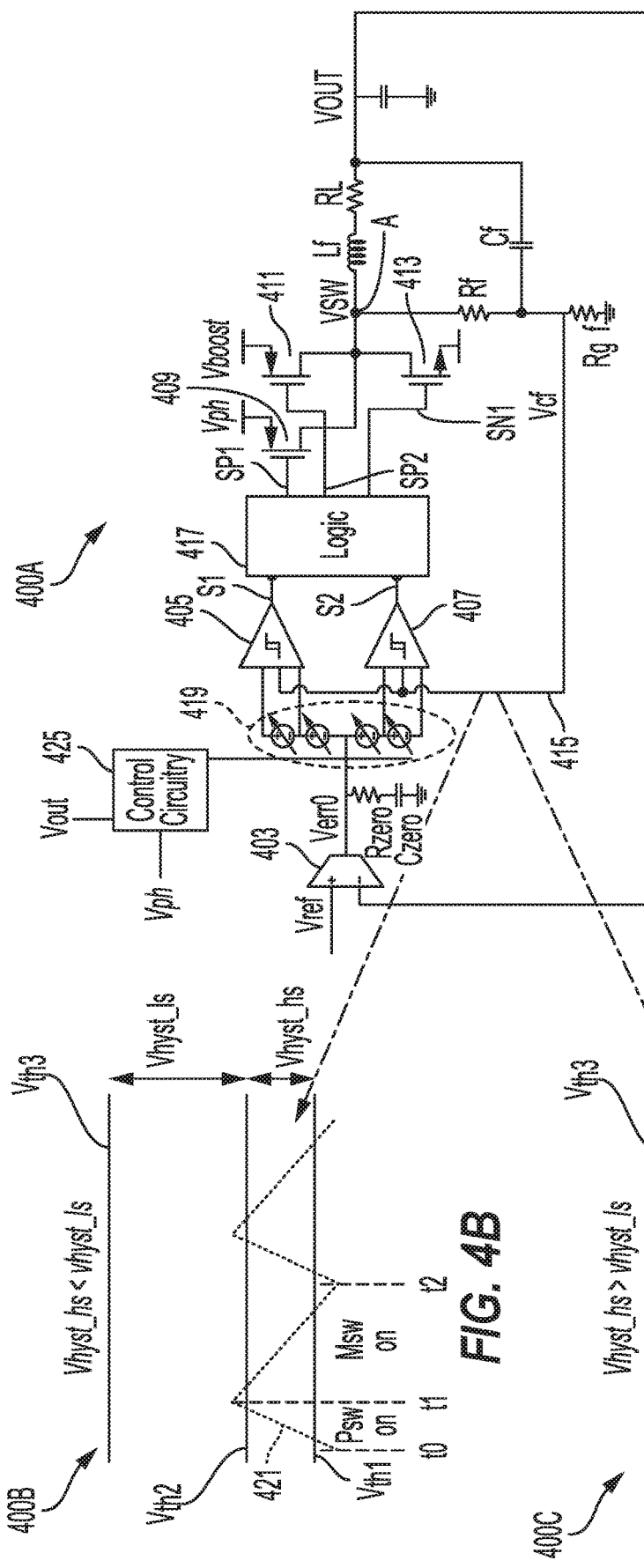

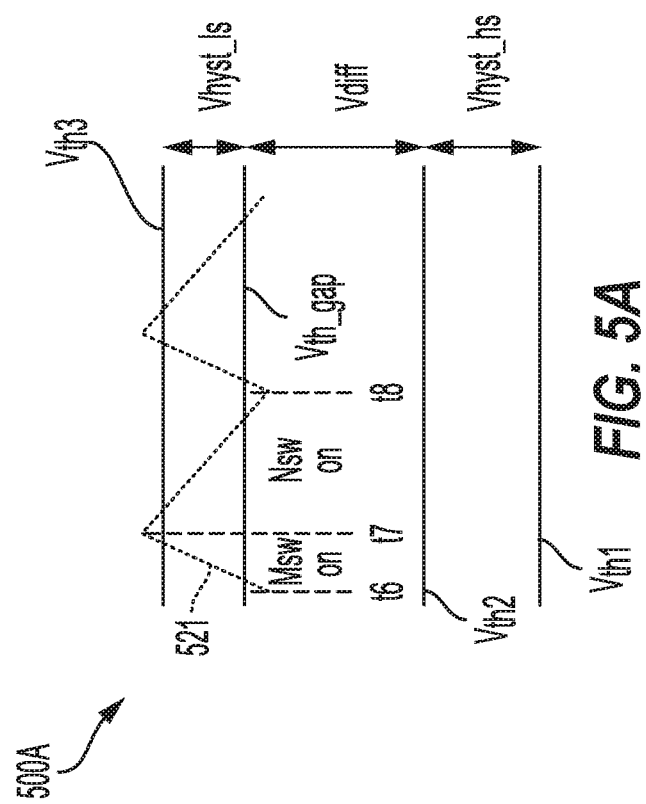
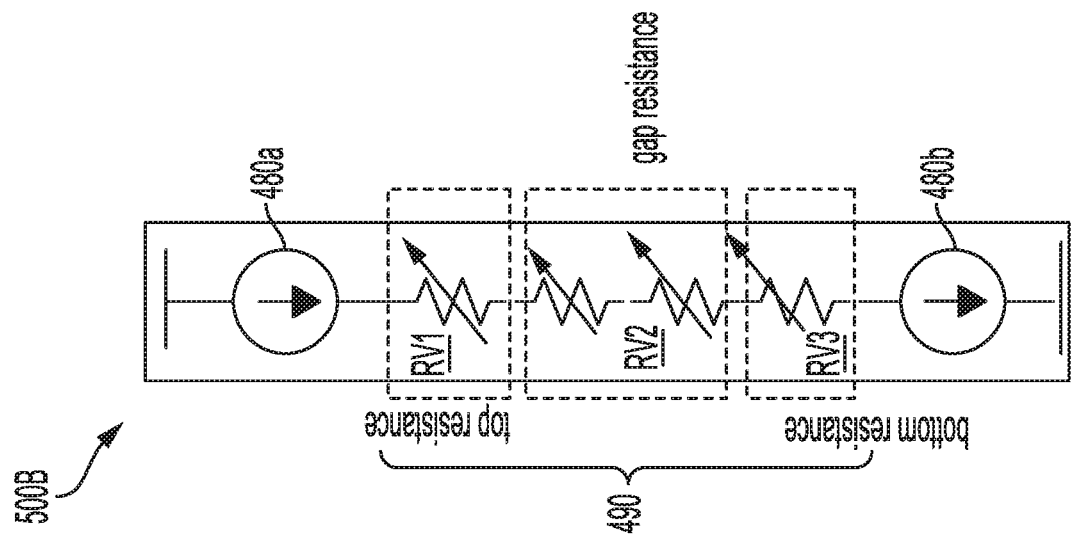
FIG. 5B
FIG. 5A

HYSTERETIC WINDOW ADJUSTMENT OF TRI-LEVEL SWITCHING REGULATOR

TECHNICAL FIELD

The present disclosure generally relates to regulator circuitry. More specifically, the present disclosure relates to dynamic adjustment of hysteretic windows of tri-level hysteretic switching regulators.

BACKGROUND

Switching regulators are circuits that produce regulated voltages or currents by switching passive elements into and out of different electrical configurations. Switching regulators are efficient circuits for providing voltages and currents, but suffer from a number of problems in certain applications. For example, one challenge with switching regulators is noise generated by the switches as they are turned ON and OFF. Optimizing switching noise and efficiency is a constraint with many existing switching regulator topologies, such as a buck topology as well as other topologies (e.g., boost, flyback, buck-boost, etc.)

Many different classes of switching regulators exist today. One type of switching regulator is a hysteretic switching regulator. Hysteretic switching regulators (e.g., buck regulators) are used in applications that may require suitable performance in transient response and/or speed of operation. One particular application where hysteretic switching regulators are employed is in envelope tracking in a power amplifier. A control scheme of these hysteretic switching regulators has variable switching frequency, which helps achieve a faster load transient response. However, average frequency control is useful for bucks that operate in an electromagnetic interference (EMI) sensitive environment such as mobile phone applications. Phase locked loops can control switching frequency, but such implementation is costly in terms of power and area, and may specify external components, such as off-chip capacitors. In addition, closed loop average frequency control methods interfere with the dynamics of the main voltage control loop.

SUMMARY

A tri-level hysteretic switching regulator has a first hysteretic comparator. The tri-level hysteretic switching regulator also has a second hysteretic comparator. The first hysteretic comparator and the second hysteretic comparator are coupled to a high-side transistor, a mid-size transistor, and a low-side transistor. The first hysteretic comparator and the second hysteretic comparator are also configured to control the high-side transistor, the mid-size transistor, and the low-side transistor. A threshold reference generation device is coupled to inputs of the first hysteretic comparator and the second hysteretic comparator. The threshold reference generation device is configured to adjust one or more hysteresis threshold voltages of the first hysteretic comparator and the second hysteretic comparator.

A method for unbalancing a tri-level switching regulator uses hysteretic control when switching across multiple states of the tri-level switching regulator. The method includes determining a battery voltage and an output voltage of the tri-level switching regulator. The method also includes dynamically adjusting at least one of a first hysteretic window of a first hysteretic comparator associated with a second switching state of the tri-level switching regulator and a second hysteretic window of a second hysteretic comparator associated with a first switching state of the tri-level switching regulator based on the battery voltage and the output voltage.

A tri-level hysteretic switching regulator has a first hysteretic comparator. The tri-level hysteretic switching regulator also has a second hysteretic comparator. The first hysteretic comparator and the second hysteretic comparator are coupled to a high-side transistor, a mid-size transistor, and a low-side transistor. The first hysteretic comparator and the second hysteretic comparator are also configured to control the high-side transistor, the mid-size transistor, and the low-side transistor. The tri-level hysteretic switching regulator includes means for generating a threshold reference. The threshold reference generating means is coupled to inputs of the first hysteretic comparator and the second hysteretic comparator. The threshold reference generating means is configured to adjust one or more hysteresis threshold voltages of the first hysteretic comparator and the second hysteretic comparator.

This has outlined, rather broadly, the features and technical advantages of the present disclosure in order that the detailed description that follows may be better understood. Additional features and advantages of the present disclosure will be described below. It should be appreciated by those skilled in the art that this present disclosure may be readily utilized as a basis for modifying or designing other structures for carrying out the same purposes of the present disclosure. It should also be realized by those skilled in the art that such equivalent constructions do not depart from the teachings of the present disclosure as set forth in the appended claims. The novel features, which are believed to be characteristic of the present disclosure, both as to its organization and method of operation, together with further objects and advantages, will be better understood from the following description when considered in connection with the accompanying figures. It is to be expressly understood, however, that each of the figures is provided for the purpose of illustration and description only and is not intended as a definition of the limits of the present disclosure.

BRIEF DESCRIPTION OF THE DRAWINGS

For a more complete understanding of the present disclosure, reference is now made to the following description taken in conjunction with the accompanying drawings.

FIG. 4A is a schematic diagram of a tri-level hysteretic switching regulator including a feedback control loop, according to aspects of the present disclosure.

FIGS. 4B and 4C are graphs illustrating inductor current ripple of the tri-level hysteretic switching regulator of FIG. 4A bounded by hysteresis parameters with respect to time, according to aspects of the present disclosure.

FIG. 5A is a graph illustrating sensed inductor current represented as a voltage ripple of the tri-level hysteretic switching regulator of FIG. 4A bounded by hysteresis parameters with respect to time, according to aspects of the present disclosure.

FIG. 5B illustrates an example of a threshold reference generation device to generate a hysteretic gap, according to aspects of the present disclosure.

DETAILED DESCRIPTION

Figure 1:
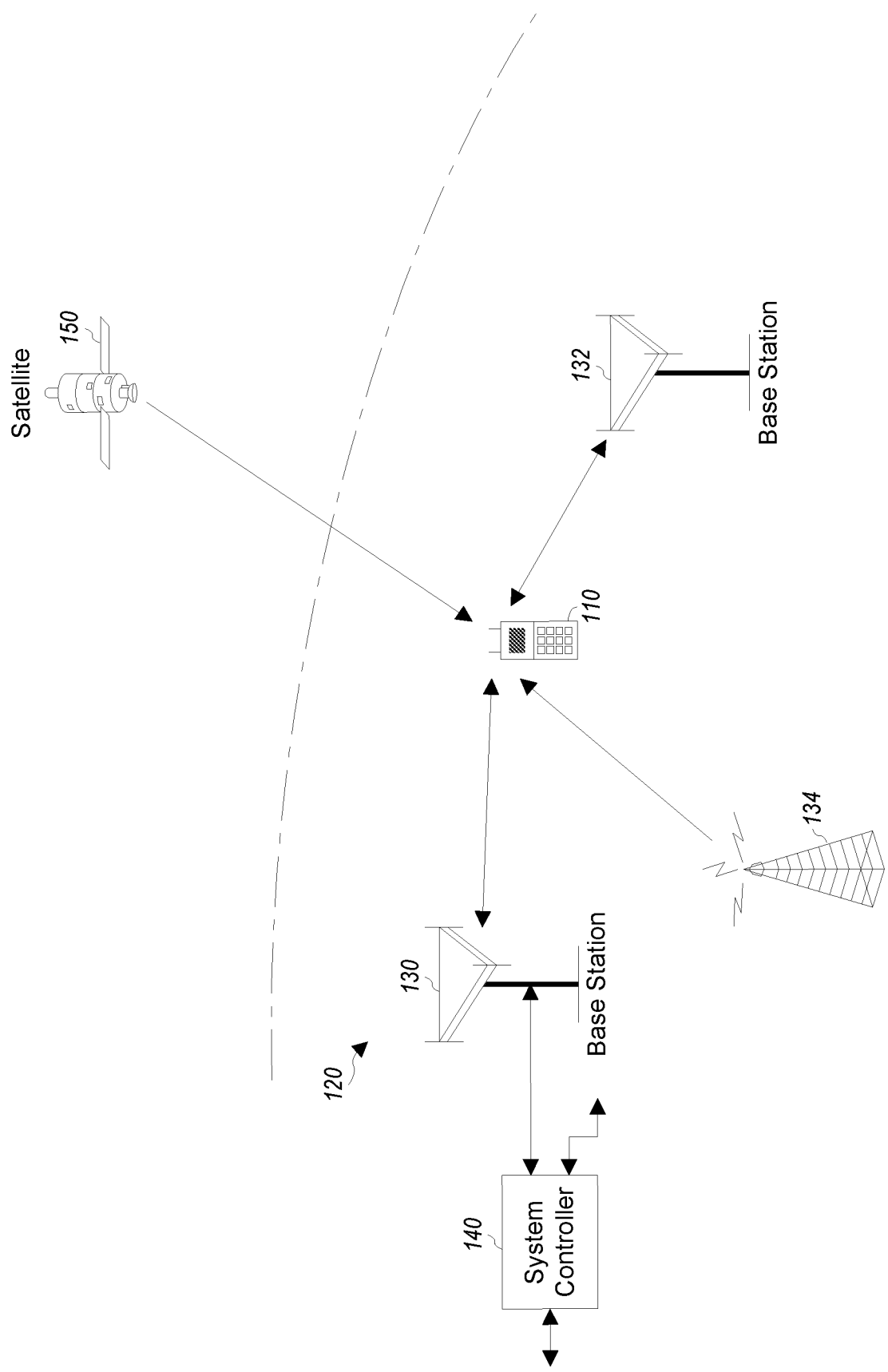
FIG. 1 shows a wireless device communicating with a wireless communications system.

The detailed description set forth below, in connection with the appended drawings, is intended as a description of various configurations and is not intended to represent the only configurations in which the concepts described herein may be practiced. The detailed description includes specific details for the purpose of providing a thorough understanding of the various concepts. However, it will be apparent to those skilled in the art that these concepts may be practiced without these specific details. In some instances, well-known structures and components are shown in block diagram form in order to avoid obscuring such concepts. As described herein, the use of the term "and/or" is intended to represent an "inclusive OR", and the use of the term "or" is intended to represent an "exclusive OR".

A hysteretic switching regulator (e.g., a tri-level buck converter) can be configured with a self-oscillating controller that regulates an output voltage by maintaining a sensed inductor current ripple to within a hysteresis window of a reference voltage. Hysteretic switching regulators can provide fast transient response with excellent dynamic power delivery characteristics.

An inductor current is sensed through a resistor-capacitor (RC) configuration scheme implemented in a feedback control loop of the hysteretic switching regulator. A resulting signal generated is a ripple voltage signal representative of the inductor current ripple and the ripple signal is maintained in a hysteretic window. The feedback control loop for hysteretic control of the tri-level buck converter includes multiple hysteretic comparators (e.g., a first hysteretic comparator and a second hysteretic comparator). A first hysteretic window of the first hysteretic comparator is equal to a second hysteretic window of the second hysteretic comparator. In this implementation, while the hysteretic window can be varied, the variance of each hysteretic window is equally specified to ensure that the first difference is equal to the second difference.

However, when the output voltage in the tri-level buck converter approaches an input voltage to the tri-level buck converter (e.g., a battery voltage Vph), one of the first hysteretic window or the second hysteretic window reduces significantly more than the other to avoid three level mis-triggering in the tri-level buck converter. Three level mis-triggering may occur when the tri-level converter switches between all three power supply signals rather than between two power supply signals for a specific switching state. The switching states may include a low-side switching state where the tri-level switching regulator switches between a battery power signal and a ground. The multiple states may also include a high-side switching state where the tri-level switching regulator switches between a boosted power supply signal and the battery voltage. The unintentional three level mis-triggering of the tri-level comparator causes a loss in efficiency and injects noise into a system.

Aspects of the present disclosure are directed to dynamically unbalancing the hysteretic window of a tri-level hysteretic switching regulator using hysteretic control (e.g., hysteretic current mode control) when switching across multiple states of the tri-level hysteretic switching regulator. The tri-level hysteretic switching regulator includes a first hysteretic comparator and a second hysteretic comparator. The first hysteretic comparator and the second hysteretic comparator are coupled to a high-side transistor, a mid-side transistor, and a low-side transistor and configured to control the high-side transistor, the mid-side transistor, and the low-side transistor. A threshold reference generation device is coupled to inputs of the first hysteretic comparator and the second hysteretic comparator. A hysteresis generation device is coupled to the threshold reference generation device. The hysteresis generation device is configured to generate hysteresis parameters to cause the threshold reference generation device to adjust a first hysteretic window of the second hysteretic comparator and/or a second hysteretic window of the first hysteretic comparator based on a battery voltage and an output voltage of the tri-level hysteretic switching regulator.

In one aspect, the hysteresis generation device (e.g., a processor) of a wireless device dynamically increases a first threshold (e.g., a hysteresis threshold voltage) of a second hysteretic window of the second hysteretic comparator for a second switching state. In one aspect, the first threshold is increased when switching between a battery power supply signal and ground supply signal corresponding to the low-side switching state. The first switching state may be the high-side switching state and the switching may include switching between the battery power supply signal and a boosted power supply signal in accordance with a high-side switching scheme.

When switching between power supply signals corresponding to the first switching state, the hysteresis generation device dynamically increases a second threshold of a first hysteretic window of the first hysteretic comparator. The aspects of the present disclosure reduce unintentional three level mis-triggering or switching for cases where the output voltage can be regulated through two level switching. The reduced switching also results in reduced injection of noise into the system.

Another issue with hysteretic switching regulators is that a switching frequency fsw is a function of the output voltage Vout, the input voltage (e.g., the battery voltage Vph) and the hysteretic window of the hysteretic switching regulator. Thus, when any of these values change (e.g., Vph or Vout), the switching frequency changes, which is undesirable because it injects noise into the system, particularly for sensitive radio frequency communications.

Some aspects of the present disclosure are directed to reducing the variation in the switching frequency. For example, based on a known battery voltage Vph and a known output voltage Vout of the hysteretic switching regulator, the hysteretic window width can be programmed or pre-defined to mitigate the switching frequency variation. For example, a lookup table of optimized battery voltages Vph and output voltages for the hysteretic switching regulator may be generated, stored (on chip), and referenced to select a desirable hysteretic window for switching. Thus, the hysteretic window or hysteretic window width may be adjusted based on reading the lookup tables.

FIG. 1 shows a wireless device 110 communicating with a wireless communications system 120. The wireless device 110 includes the tri-level hysteretic switching regulator and avails itself of the advantages of the tri-level hysteretic switching regulator. The wireless communications system 120 may be a 5G system, a long term evolution (LTE) system, a code division multiple access (CDMA) system, a global system for mobile communications (GSM) system, a wireless local area network (WLAN) system, millimeter wave (mmW) technology, or some other wireless system. A CDMA system may implement wideband CDMA (WCDMA), time division synchronous CDMA (TD-SCDMA), CDMA2000, or some other version of CDMA. In a millimeter wave (mmW) system, multiple antennas are used for beamforming (e.g., in the range of 30 GHz, 60 GHz, etc.). For simplicity, FIG. 1 shows the wireless communications system 120 including two base stations 130 and 132 and one system controller 140. In general, a wireless system may include any number of base stations and any number of network entities.

A wireless device 110 may be referred to as a user equipment (UE), a mobile station, a terminal, an access terminal, a subscriber unit, a station, etc. The wireless device 110 may also be a cellular phone, a smartphone, a tablet, a wireless modem, a personal digital assistant (PDA), a handheld device, a laptop computer, a Smartbook, a netbook, a cordless phone, a wireless local loop (WLL) station, a Bluetooth device, etc. The wireless device 110 may be capable of communicating with the wireless communications system 120. The wireless device 110 may also be capable of receiving signals from broadcast stations (e.g., a broadcast station 134), signals from satellites (e.g., a satellite 150) in one or more global navigation satellite systems (GNSS), etc. The wireless device 110 may support one or more radio technologies for wireless communications such as 5G, LTE, CDMA2000, WCDMA, TD-SCDMA, GSM, 802.11, etc.

The wireless device 110 may support carrier aggregation, which is operation on multiple carriers. Carrier aggregation may also be referred to as multi-carrier operation. According to an aspect of the present disclosure, the wireless device 110 may be able to operate in low-band from 698 to 960 megahertz (MHz), mid-band from 1475 to 2170 MHz, and/or high-band from 2300 to 2690 MHz, ultra-high band from 3400 to 3800 MHz, and long-term evolution (LTE) in LTE unlicensed bands (LTE-U/LAA) from 5150 MHz to 5950 MHz. Low-band, mid-band, high-band, ultra-high band, and LTE-U refer to five groups of bands (or band groups), with each band group including a number of frequency bands (or simply, "bands"). For example, in some systems each band may cover up to 200 MHz and may include one or more carriers. For example, each carrier may cover up to 40 MHz in LTE. Of course, the range for each of the bands is merely exemplary and not limiting, and other frequency ranges may be used. LTE Release 11 supports 35 bands, which are referred to as LTE/UMTS bands and are listed in 3GPP TS 36.101. The wireless device 110 may be configured with up to five carriers in one or two bands in LTE Release 11.

Some carrier aggregation implementations in the sub 6 GHz include multiple frequency bands in the millimeter wave frequency range, such as frequency bands located near 24 gigahertz (GHz), 26 GHz, 28 GHz, 37 GHz, 39 GHz, 48 GHz, and 56 to 71 GHz. For example, these bands may include 24.25-24.45 GHz, 24.75-25.25 GHz, 27.5-28.35 GHz, and 37-40 GHz. In these systems, the carriers may be 50 MHz, 100 MHz, 200 MHz, or 400 MHz and the bands may be up to 2.4 GHz and may include one or more carriers.

Figure 2:
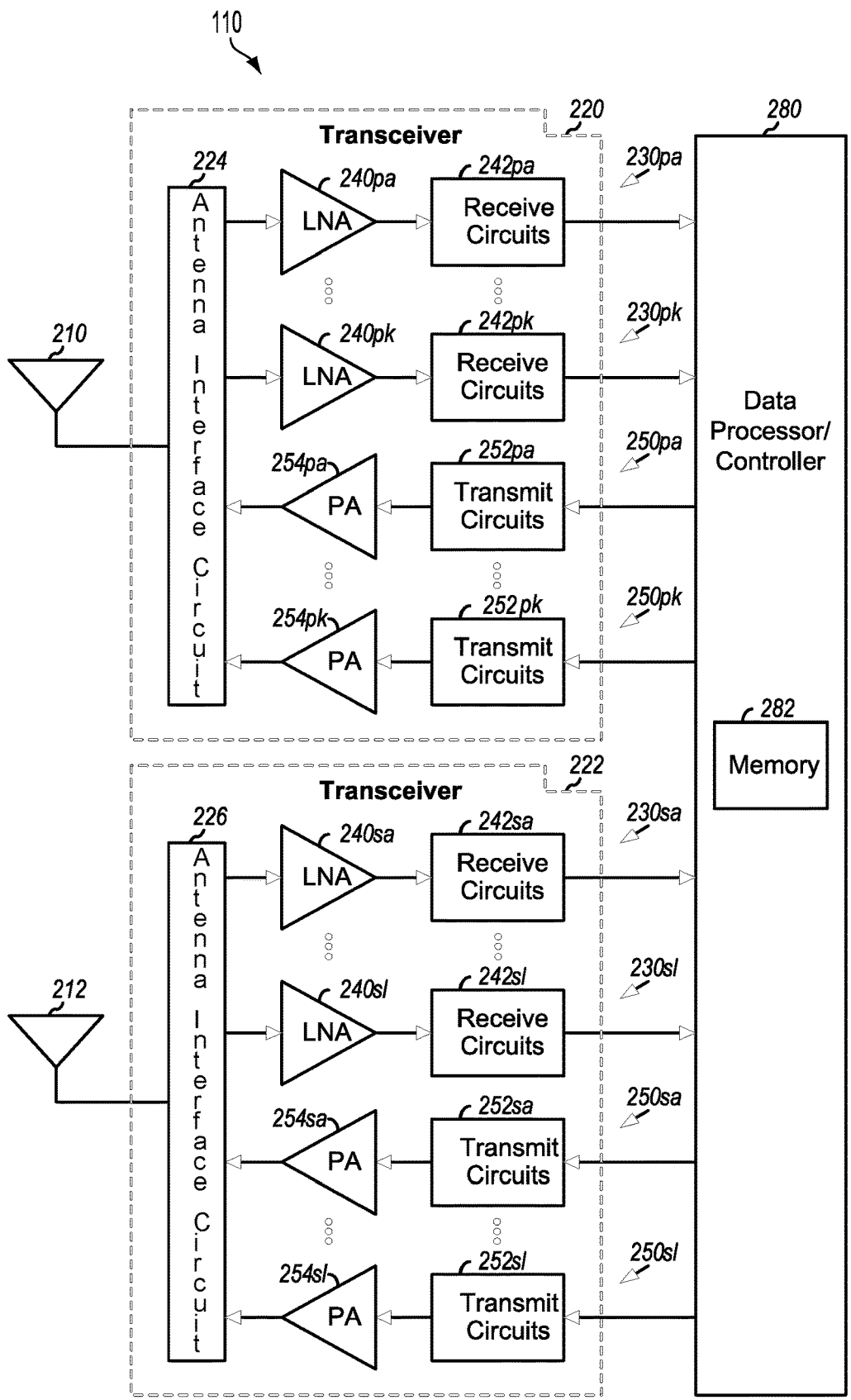
FIG. 2 shows a block diagram of the wireless device in FIG. 1, according to an aspect of the present disclosure.

FIG. 2 shows a block diagram of an exemplary design of the wireless device 110 in FIG. 1. In this exemplary design, the wireless device 110 includes a transceiver 220 coupled to a primary antenna 210, a transceiver 222 coupled to a secondary antenna 212, and a data processor/controller 280. The transceiver 220 includes multiple (K) receivers 230pa to 230pk and multiple (K) transmitters 250pa to 250pk to support multiple frequency bands, multiple radio technologies, carrier aggregation, etc. The transceiver 222 includes L receivers 230sa to 230sl and L transmitters 250sa to 250sl to support multiple frequency bands, multiple radio technologies, carrier aggregation, receive diversity, multiple-input multiple-output (MIMO) transmission from multiple transmit antennas to multiple receive antennas, etc.

In the exemplary design shown in FIG. 2, each receiver 230 includes a low-noise amplifier (LNA) 240 and receive circuits 242. For data reception, the antenna 210 receives signals from base stations and/or other transmitter stations and provides a received radio frequency (RF) signal, which is routed through an antenna interface circuit 224 and presented as an input RF signal to a selected receiver 230. An antenna interface circuit 224 may include switches, duplexers, transmit filters, receive filters, matching circuits, etc. The description below assumes that the receiver 230pa is the selected receiver. Within the receiver 230pa, an LNA 240pa amplifies the input RF signal and provides an output RF signal. Receive circuits 242pa downconvert the output RF signal from RF to baseband, amplify and filter the downconverted signal, and provide an analog input signal to data processor 280. Receive circuits 242pa may include mixers, filters, amplifiers, matching circuits, an oscillator, a local oscillator (LO) generator, a phase locked loop (PLL), etc. Each remaining receiver 230 in the transceivers 220 and 222 may operate in a similar manner as the receiver 230pa.

In the exemplary design shown in FIG. 2, each transmitter 250 includes transmit circuits 252 and a power amplifier (PA) 254. For example, the tri-level hysteretic switching regulator along with an envelope tracking amplifier modulates the power supply to the power amplifier 254. For data transmission, a data processor 280 processes (e.g., encodes and modulates) data to be transmitted and provides an analog output signal to a selected transmitter. The description below assumes that the transmitter 250pa is the selected transmitter. Within the transmitter 250pa, transmit circuits 252pa amplify, filter, and upconvert the analog output signal from baseband to RF and provide a modulated RF signal. The transmit circuits 252pa may include amplifiers, filters, mixers, matching circuits, an oscillator, an LO generator, a PLL, etc. A power amplifier (PA) 254pa receives and amplifies the modulated RF signal and provides a transmit RF signal having the proper output power level. The transmit RF signal is routed through the antenna interface circuit 224 and transmitted via the antenna 210. Each remaining transmitter 250 in the transceivers 220 and 222 may operate in a similar manner as the transmitter 250pa.

FIG. 2 shows an exemplary design of a receiver 230 and transmitter 250. The receiver 230 and a transmitter 250 may also include other circuits not shown in FIG. 2, such as filters, matching circuits, etc. All or a portion of transceivers 220 and 222 may be implemented on one or more analog integrated circuits (ICs), RF ICs (RFICs), mixed-signal ICs, etc. For example, LNAs 240 and receive circuits 242 within transceivers 220 and 222 may be implemented on multiple ICs, as described below. The circuits in transceivers 220 and 222 may also be implemented in other manners.

The data processor/controller 280 may perform various functions for the wireless device 110. For example, the data processor 280 may perform processing for data being received via the receivers 230 and data being transmitted via the transmitters 250. The controller 280 may control the operation of the various circuits within the transceivers 220 and 222. In some aspects, the transceivers 220 and 222 may also comprise a controller to control various circuits within the respective transceiver (e.g., LNAs 240). A memory 282 may store program codes and data for the data processor/controller 280. The data processor/controller 280 may be implemented on one or more application specific integrated circuits (ASICs) and/or other ICs.

Figure 3:
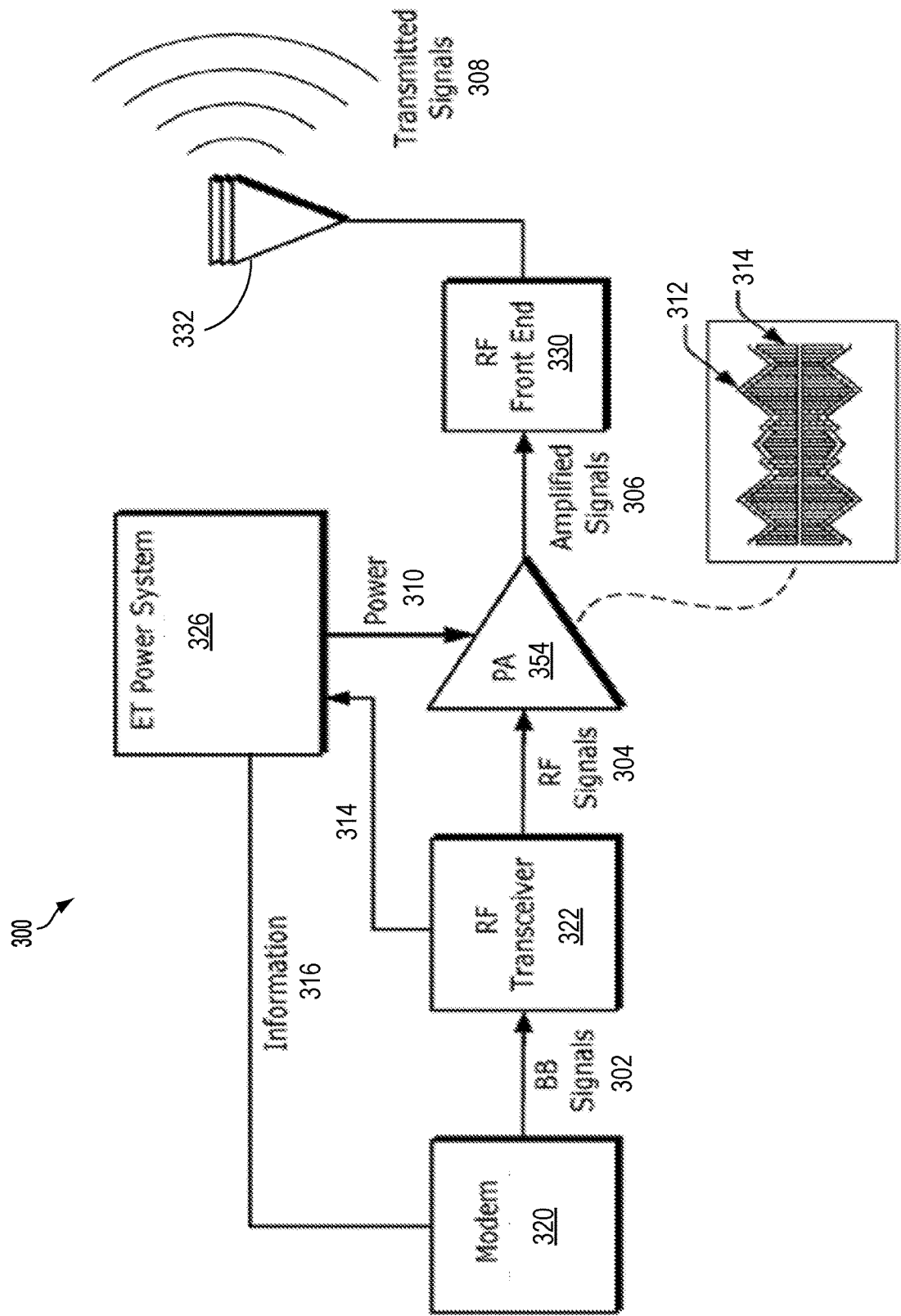
FIG. 3 illustrates a power tracking mechanism for a radio frequency power amplifier.

FIG. 3 illustrates a configuration of the wireless interface 300 including an envelope tracking power system 326 for a radio frequency power amplifier 354. A transmit path through components of the wireless interface 300 are shown. Although not shown, a receive path may be implemented in similar fashion with received signals bypassing the power amplifier 354 (e.g., via a low-noise amplifier (LNA)) from a radio frequency (RF) front end 330 to an RF transceiver 322.

A modem 320 coordinates with one of the base stations 130 and 132 to establish and define parameters of a communications link. For example, the modem 320 can receive information describing a communications mode, physical broadcast channels, transmit bands, receive bands, antenna configuration, link bandwidth, resource mapping, and the like. Based on this information, the modem 320 configures other components of the wireless interface 300 for signal transmission and/or reception, such as the RF transceiver 322, the power amplifier 354, and the RF front end 330.

Generally, to transmit data, the modem 320 encodes the data into baseband signals 302 (BB signals 302). These BB signals 302 are then modulated by the RF transceiver 322 with a carrier frequency to provide RF signals 304. Prior to transmission, the power amplifier 354 amplifies the RF signals 304 and the amplified signals 306 enter the RF front end 330 for routing or band-specific filtering. An antenna 332 then radiates the amplified signals 306 as transmitted signals 308, which are received by the base station 130 or 132 with which the communications link is established.

During amplification, the power amplifier 354 receives power 310 from the envelope tracking power system 326, which is described in more detail below. The ET power system 326 adjusts a voltage 312 at which the power 310 is provided to the power amplifier 354 such that the voltage 312 follows an envelope 314 of the RF signals 304 being amplified.

FIG. 4A is a schematic diagram of a tri-level hysteretic switching regulator 400A including a feedback control loop to generate an unbalanced window threshold, according to aspects of the present disclosure. The tri-level hysteretic switching regulator 400A receives an input voltage (e.g., a battery voltage Vph or an auxiliary/boosted voltage Vboost) and generates an output voltage Vout for a load RL. The tri-level hysteretic switching regulator 400A can switch between three voltage levels including the battery voltage Vph, the boosted voltage Vboost, and ground. The tri-level hysteretic switching regulator 400A includes a first transistor 409 (e.g., a P-type metal oxide semiconductor field effect transistor (PFET) represented as Msw), a second transistor 411 (e.g., a PFET represented as Psw), and a third transistor 413 (e.g., an N-type metal oxide semiconductor field effect transistor (NFET) represented as Nsw) that operate to provide a switch voltage VSW at node A. The first transistor 409 is a mid-side transistor, the second transistor 411 is a high-side transistor, and the third transistor 413 is a low-side transistor.

The tri-level hysteretic switching regulator 400A further includes an inductor Lf. The inductor Lf has one end coupled to node A and the other end coupled to the load RL. An inductor current sensor formed by resistors Rf and Rg and capacitor Cf receive a voltage across the inductor Lf through an output voltage VOUT node on a first end of the inductor Lf and the switch voltage VSW node on the second side of the inductor Lf. The inductor current sensor formed by resistors Rf and Rg and capacitor Cf outputs a voltage Vcf representative of current through the inductor Lf (e.g., inductor current ripple). The voltage Vcf representative of the current through the inductor Lf is input to a first hysteretic comparator 405 and a second hysteretic comparator 407.

Comparators (the first hysteretic comparator 405 and the second hysteretic comparator 407) differentiate between two different signal levels. Noise or signal variation at a comparison threshold causes multiple transitions. Hysteresis sets an upper and a lower threshold to eliminate the multiple transitions caused by noise.

The output voltage Vout is input to an error amplifier 403. A reference voltage Vref is also input to the error amplifier 403. The reference voltage Vref is a target voltage for Vout and may be a fixed value or a configurable value. The error amplifier 403 compares the two voltages to obtain an error, amplifies the error, and provides an amplified error signal Verr0 to a threshold reference generation device 419 coupled to inputs of the first hysteretic comparator 405 and the second hysteretic comparator 407. A resistor Rzero and a capacitor Czero at the output of the error amplifier 403 provide filtering and frequency compensation.

A hysteresis generation device 425 or control circuitry receives the output voltage Vout, and the battery voltage Vph. The circuitry of the hysteresis generation device 425 generates a hysteresis parameter, which may be a hysteresis voltage Vhyst or a hysteresis current Ihyst. The hysteresis parameter used further in this example is a hysteresis voltage Vhyst. The hysteresis generation device 425 is configured to generate a hysteresis parameter that allows the tri-level hysteretic switching regulator 400A to operate at a relatively constant frequency. The switching frequency is a function of the battery voltage Vph and the output voltage Vout. The threshold reference generation device 419 receives signals from the hysteresis generation device 425 that cause the threshold reference generation device 419 to adjust thresholds (e.g., hysteresis threshold voltages) of the first hysteretic comparator 405 and the second hysteretic comparator 407. Adjusting the thresholds adjusts the first hysteretic window of the first hysteretic comparator or adjusts the second hysteretic window of the second hysteretic comparator. The adjustment may be based on the battery voltage Vph and an output voltage Vout of the tri-level hysteretic switching regulator 400A.

The first hysteretic comparator 405 and the second hysteretic comparator 407 receive the amplified error signal Verr0 from the error amplifier 403 via the threshold reference generation device 419, the voltage Vcf is representative of current through the inductor Lf, and the hysteresis voltage Vhyst from the hysteresis generation device 425 and generates control signals for the first transistor 409, the second transistor 411, and the third transistor 413. The control signals may be provided to the first transistor 409, the second transistor 411, and the third transistor 413 via a logic circuit or switch driver controller 417.

For example, the first hysteretic comparator 405 compares a summation of the amplified error signal Verr0 and one or more thresholds representative of the voltage hysteresis Vhyst to the voltage Vcf representative of current through the inductor Lf and outputs a first signal S1. The second hysteretic comparator 407 compares a difference of the amplified error signal Verr0 and one or more thresholds representative of the voltage hysteresis Vhyst to the voltage Vcf representative of current through the inductor Lf and outputs a second signal S2.

The first signal S1 and the second signal S2 of the first hysteretic comparator 405 and the second hysteretic comparator 407 are input to the switch driver controller 417 and output respectively as switch control signals SP1, SP2, and SN1. In some aspects, the first hysteretic comparator 405 and the second hysteretic comparator 407 are directly coupled to the first transistor 409, the second transistor 411, and the third transistor 413. The switch control signal SP1 drives a gate of the first transistor 409 and the switch control signal SP2 drives a gate of the second transistor 411, while the switch control signal SN1 drives a gate of the third transistor 413. The first transistor 409 may be a P-type metal oxide semiconductor (PMOS) field effect transistor (PFET) with its source coupled to the battery voltage Vph, its gate receiving the SP1 control signal, and its drain coupled to node A. The second transistor 411 may be a PFET with its source coupled to the auxiliary voltage Vboost, its gate receiving the SP2 control signal, and its drain coupled to node A. The third transistor 413 may be an N-type metal oxide semiconductor (NMOS) field effect transistor (NFET) with its drain coupled to the node A, its gate receiving the SN1 control signal, and its source coupled to circuit ground.

The first transistor 409 and the second transistor 411 are respectively turned on when the SP1 control signal and the SP2 control signal are at logic low, and the third transistor 413 is turned on when the SN1 control signal is at logic high. The first transistor 409, the second transistor 411, and the third transistor 413 provide the switch voltage Vsw output signal at node A. This output signal is a square wave signal that swings from the battery voltage Vph to circuit ground or swings from the auxiliary voltage Vboost to the battery voltage Vph.

The mid-side transistor is the first transistor 409, the high-side transistor is the second transistor 411, and the low-side transistor is the third transistor 413. The first hysteretic comparator 405 and the second hysteretic comparator 407 are coupled to the mid-side transistor, the high-side transistor, and the low-side transistor. In some aspects, the first hysteretic comparator 405 and the second hysteretic comparator 407 are directly coupled (not shown) to the mid-side transistor, the high-side transistor and the low-side transistor. In other aspects, the first hysteretic comparator 405 and the second hysteretic comparator 407 are indirectly coupled (e.g., through a logic gated transistor or circuit) to the mid-side transistor, the high-side transistor and the low-side transistor. The first hysteretic comparator 405 and the second hysteretic comparator 407 are configured to control the mid-side transistor, the high-side transistor, and the low-side transistor.

The first hysteretic comparator 405 is configured for low-side switching and the second hysteretic comparator 407 is configured for high-side switching. In one aspect of the disclosure, the threshold reference generation device 419 comprises variable resistors or programmable resistors. For example, a control signal (e.g., current) through the variable resistor or programmable resistor can modify the first hysteretic window of the first hysteretic comparator 405 or the second hysteresis window of the second hysteretic comparator 407. The control signal may be indicative of the hysteresis parameter from the hysteresis generation device 425.

FIG. 4B is a graph 400B illustrating a voltage ripple 421 (e.g., the voltage Vcf is representative of the current through the inductor Lf) of the tri-level hysteretic switching regulator 400A of FIG. 4A bounded by hysteresis parameters with respect to time, according to aspects of the present disclosure. For illustrative purposes, some of the labelling and numbering of the devices and features of FIG. 4B are similar to those of FIG. 4A. A horizontal axis of the graph 400B corresponds to time and a vertical axis corresponds to voltage.

In one aspect, a processor or controller (e.g., the hysteresis generation device 425) of a wireless device in which the tri-level hysteretic switching regulator 400A is included determines current battery voltage Vph and output voltage Vout of the tri-level switching regulator. Based on the current battery voltage Vph and the output voltage Vout, the hysteresis generation device 425 provides the hysteresis parameter (e.g., hysteresis voltage Vhyst or hysteretic window width) to dynamically adjust the first hysteretic window of the first hysteretic comparator 405 associated with the second switching state and/or the second hysteretic window of the second hysteretic comparator 407 associated with the first switching state.

In some instances, where the first hysteretic comparator 405 and the second hysteretic comparator 407 have equal hysteresis window widths (e.g., vhyst_hs=vhyst_ls), the tri-level hysteretic switching regulator 400A may be subject to unintentional three level switching, which causes a loss in efficiency and injects noise into a system. To mitigate the three level mis-triggering, the hysteresis generation device 425 adjusts the hysteresis parameter (e.g., to hysteresis voltage Vhyst_hs or high-side hysteretic window width and/or to Vhyst_ls or low-side hysteretic window width).

For example, the adjusted hysteresis parameter causes a third hysteresis threshold voltage Vth3 associated with the first hysteretic window of the first hysteretic comparator 405 to be increased. The third hysteresis threshold voltage Vth3 is increased to prevent the sensed inductor current represented as a voltage ripple 421 from crossing the third hysteresis threshold voltage Vth3 when switching between power supply signals corresponding to the first switching state. The first switching state includes switching between the battery supply signal Vph and the boosted power supply Vboost signal, in accordance with the high-side switching scheme. During the switching, the second transistor 411 is on between times t0 and t1 and the first transistor 409 is on between times t1 and t2.

The first hysteretic window corresponds to the hysteresis voltage Vhyst_ls, which is a difference between a second hysteresis threshold voltage Vth2 and the third hysteresis threshold voltage Vth3. The second hysteretic window corresponds to a hysteresis voltage Vhyst_hs, which is a difference between the second hysteresis threshold voltage Vth2 and a first hysteresis threshold voltage Vth1. In some aspects, the third hysteresis threshold voltage Vth3 is increased while the first hysteresis threshold voltage Vth1 is reduced. In one aspect, the first hysteresis threshold voltage Vth1 of the first hysteretic window is dynamically reduced and the third hysteresis threshold voltage Vth3 of the second hysteretic window is dynamically increased during high-side switching and when a difference (e.g., +/−500 millivolts) between the battery voltage and the output voltage is less than a pre-defined or dynamic threshold voltage (e.g., a programmable threshold voltage). Thus, the high-side switching is controlled by the hysteresis voltage Vhyst_hs and the second hysteretic comparator 407 and the low-side switching is controlled by the hysteresis voltage Vhyst_ls and the first hysteretic comparator 405.

FIG. 4C is another graph illustrating a voltage (e.g., the voltage Vcf is representative of the current through the inductor Lf) of the tri-level hysteretic switching regulator 400A of FIG. 4A bounded by hysteresis parameters with respect to time, according to aspects of the present disclosure. For illustrative purposes, some of the labelling and numbering of the devices and features of FIG. 4C are similar to those of the FIGS. 4A and 4B.

Referring to FIG. 4C, the adjusted hysteresis parameter causes a first hysteresis threshold voltage Vth1 associated with the second hysteretic window (e.g., Vhyst_hs) of the second hysteretic comparator 407 to be increased. The first hysteresis threshold voltage Vth1 is increased (which correspondingly increase Vhyst_hs) to prevent the sensed inductor current represented as a voltage ripple 423 from triggering or crossing the first hysteresis threshold voltage Vth1 when switching between power supply signals corresponding to the second switching state. The first switching state (high-side switching) includes switching between the battery supply signal Vph and the boosted supply signal Vboost and the second switching state (low-side switching) includes switching between the battery supply signal Vph and the ground signal. During the low-side switching, the first transistor 409 is on between times t3 and t4 and the third transistor 413 is on between times t4 and t5.

In some aspects, the third hysteresis threshold voltage Vth3 is reduced while the first hysteresis threshold voltage Vth1 is increased. For example, the first hysteresis threshold voltage Vth1 of the first hysteretic window is dynamically increased and the third hysteresis threshold voltage Vth3 of the second hysteretic window is dynamically reduced during low-side switching and when a difference (e.g., +/−500 millivolts) between the battery voltage and the output voltage does not meet a pre-defined or dynamic threshold. For example, when the difference between the battery voltage and the output voltage is less than pre-defined or dynamic threshold. The pre-defined or dynamic threshold may be programmable.

Figure 4D:
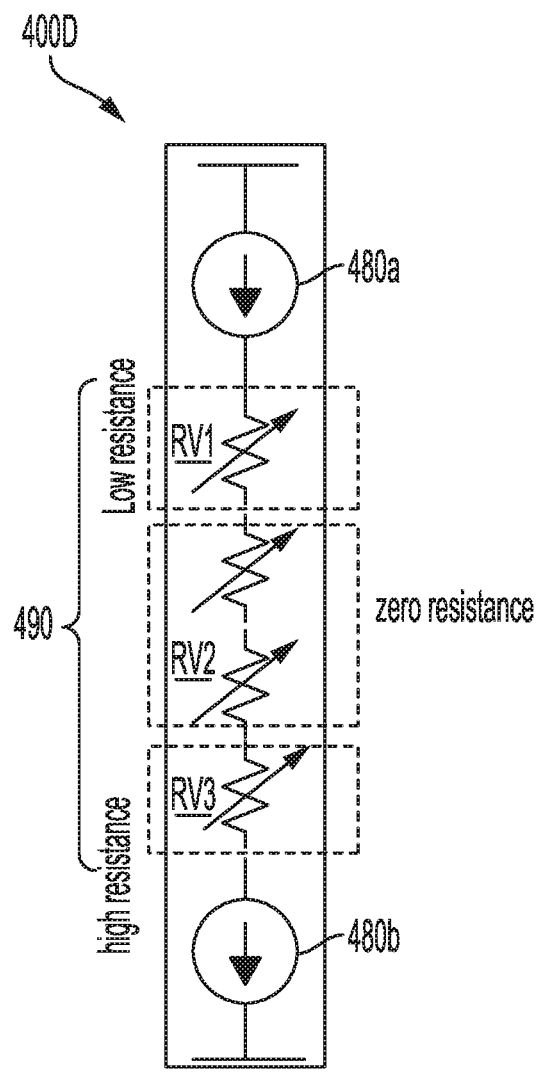
FIG. 4D illustrates an example of a threshold reference generation device to generate an unbalanced hysteretic window threshold, according to aspects of the present disclosure.

FIG. 4D illustrates an example of a threshold reference generation device 400D (e.g., the threshold reference generation device 419) to generate an unbalanced hysteretic window threshold, according to aspects of the present disclosure. In one aspect of the disclosure, the threshold reference generation device 400D includes a variable resistor 490 or programmable resistor. The variable resistor 490 includes a top variable resistor RV1, a middle variable resistor RV2, and a bottom variable resistor RV3. For example, a control signal (e.g., current from a top current source 480a and/or a bottom current source 480b) through the variable resistor 490 can modify the first hysteretic window of the first hysteretic comparator 405 or the second hysteresis window of the second hysteretic comparator 407. The control signal may be indicative of the hysteresis parameter from the hysteresis generation device 425.

For example, the first hysteresis threshold voltage Vth1 of the second hysteretic window is dynamically increased and the third hysteresis threshold voltage Vth3 of the first hysteretic window is dynamically reduced during low-side switching and when a difference between the battery voltage and the output voltage meets a threshold value. For example, when a difference between the battery voltage and the output voltage is greater than (or less than) a pre-defined or dynamic threshold. In this case, the bottom variable resistor RV3 is increased to increase the high-side hysteretic window width Vhyst_hs. The top variable resistor RV1 is decreased to decrease the low-side hysteretic window width Vhyst_ls and the middle variable resistor RV2 is decreased to zero in order to decrease the hysteretic or hysteresis voltage gap to zero. The hysteresis voltage gap may be programmable.

The third hysteresis threshold voltage Vth3 is increased to prevent the sensed inductor current represented as the voltage ripple 421 from triggering or crossing the third hysteresis threshold voltage Vth3 when switching between power supply signals corresponding to the first switching state (e.g., high-side switching). In this case, the top variable resistor RV1 is increased to increase the high-side hysteretic window width Vhyst_hs. The bottom variable resistor RV3 is decreased to decrease the low-side hysteretic window width Vhyst_ls and the middle variable resistor RV2 is decreased to zero in order to decrease the hysteretic gap to zero.

FIG. 5A is a graph 500A illustrating sensed inductor current represented as a voltage ripple of the tri-level hysteretic switching regulator of FIG. 4A bounded by hysteresis parameters with respect to time, according to aspects of the present disclosure. For illustrative purposes, some of the labelling and numbering of the devices and features of FIG. 5A are similar to those of the FIGS. 4A, 4B, and 4C. FIG. 5A shows a low-side buck regulator is switching. For example, a sensed inductor current represented as a voltage ripple 521 is switching between a gap hysteresis threshold voltage Vth_gap and a third hysteresis threshold voltage Vth3. During the switching, the first transistor 409 is on between times t6 and t7 and the third transistor 413 is on between times t7 and t8.

A voltage difference Vdiff or hysteretic voltage gap is created (e.g., by the hysteresis generation device 425) between a second hysteresis threshold voltage Vth2 of the second hysteretic comparator 407 configured for high-side switching and a gap hysteresis threshold voltage Vth_gap of the first hysteretic comparator configured for low-side switching. The voltage difference Vdiff may be programmable. The voltage difference Vdiff mitigates undesired three level mis-triggering of the tri-level hysteretic switching regulator 400A.

FIG. 5B illustrates an example of a threshold reference generation device 500B to generate a hysteretic gap, according to aspects of the present disclosure. For illustrative purposes, some of the labelling and numbering of the devices and features of FIG. 5B are similar to those of FIG. 4D. To generate the hysteretic gap, the top variable resistor RV1 and the bottom variable resistor RV3 are maintained at some pre-defined value while the middle variable resistor RV2 is increased to another pre-defined value that is not zero. Thus, a voltage gap is created between Vth_gap and the second hysteresis threshold voltage Vth2.

Figure 6B:
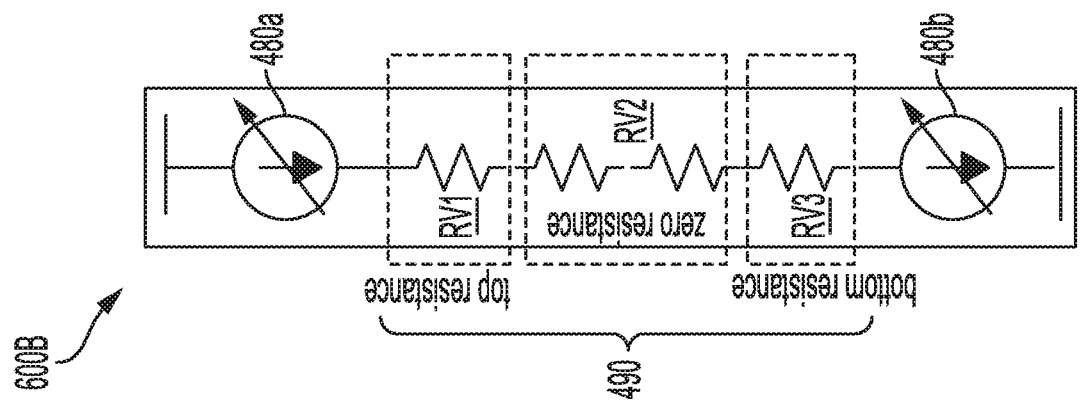
FIG. 6B illustrates an example of a threshold reference generation device to generate a modified window width, according to aspects of the present disclosure.
Figure 6A:
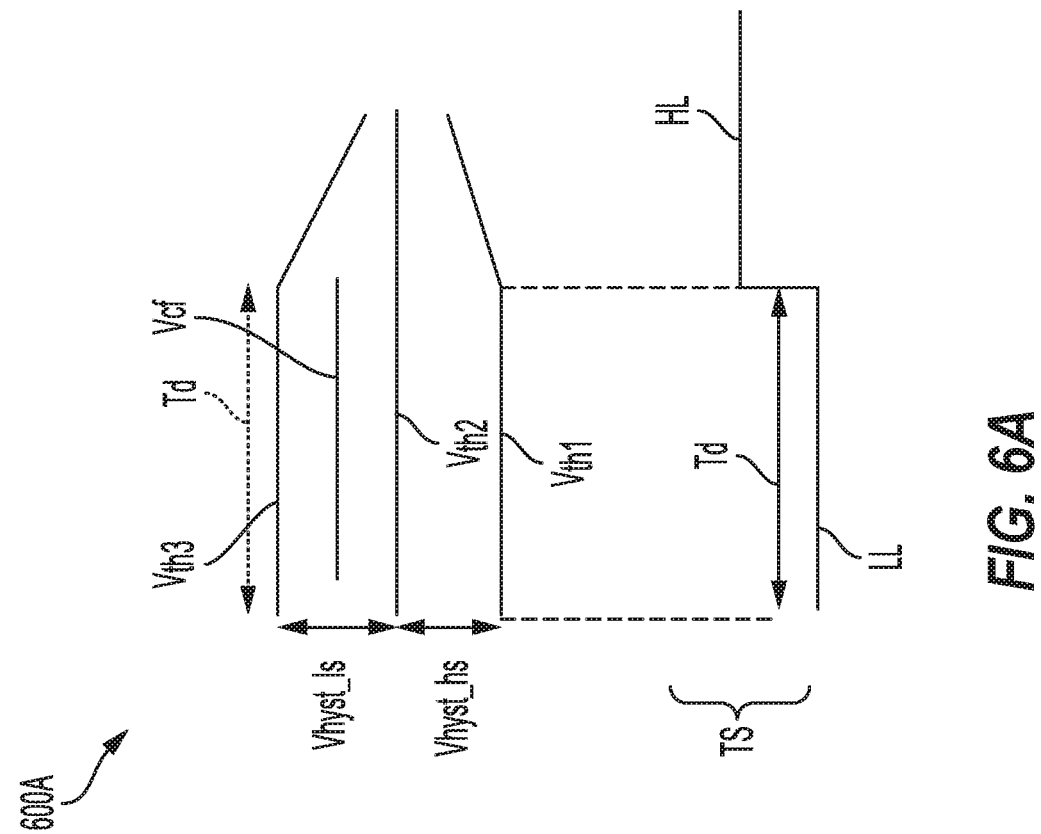
FIG. 6A is a graph illustrating fixed/programmable hysteretic window modification, according to aspects of the present disclosure.

FIG. 6A is a graph 600A illustrating a fixed/programmable hysteretic window modification juxtaposed against a time signal TS, according to aspects of the present disclosure. For illustrative purposes, some of the labelling and numbering of the devices and features of FIG. 6A are similar to those of the FIGS. 4A, 4B, and 4C.

When a difference between the battery voltage and the output voltage is less than a pre-defined threshold voltage (e.g., a delta voltage of +/−200 millivolts) or the battery voltage and the output voltage are substantially the same, a slope of the voltage Vcf representative of current through the inductor Lf is almost zero. The reduced difference between the battery voltage Vph and the output voltage Vout causes an undesirable variation in the switching frequency, which is a function of the battery voltage Vph and the output voltage Vout.

Aspects of the present disclosure are directed to mitigating the switching frequency variation by modifying a hysteretic window to generate a modified hysteretic window width. The modification of the hysteretic window width may be based on a fixed or dynamic (e.g., programmable) function. For example, the first hysteresis threshold voltage Vth1 and/or the third hysteresis threshold voltage Vth3 are decreased after a pre-defined time Td or dynamically defined time when the output voltage Vout is approximately equal to the battery voltage Vph. The difference may be compared to a small threshold to determine when to modify the hysteretic window. For example, the hysteretic window width is maintained until after an expiration of the pre-defined time Td when the time signal TS changes from a low signal level LL to a high signal level HL. The hysteretic window width is reduced during the high signal level HL.

FIG. 6B illustrates an example of a threshold reference generation device 600B to generate a modified window width, according to aspects of the present disclosure. For illustrative purposes, some of the labelling and numbering of the devices and features of FIG. 6B are similar to those of FIGS. 4D and 5B. To generate the modified hysteretic window width, the top current source 480a or the bottom current source 480b remains constant until the end of the pre-defined time Td of a time signal. After the pre-defined time Td ends, the time signal is adjusted from the low signal level LL to the high signal level HL, and the top current source 480a and/or the bottom current source 480b are reduced linearly. This scheme repeats in every switching cycle of the time signal TS. For example, the scheme starts with a constant current during the pre-defined time Td and then the top current source 480a and/or the bottom current source 480b are reduced linearly.

Figure 7:
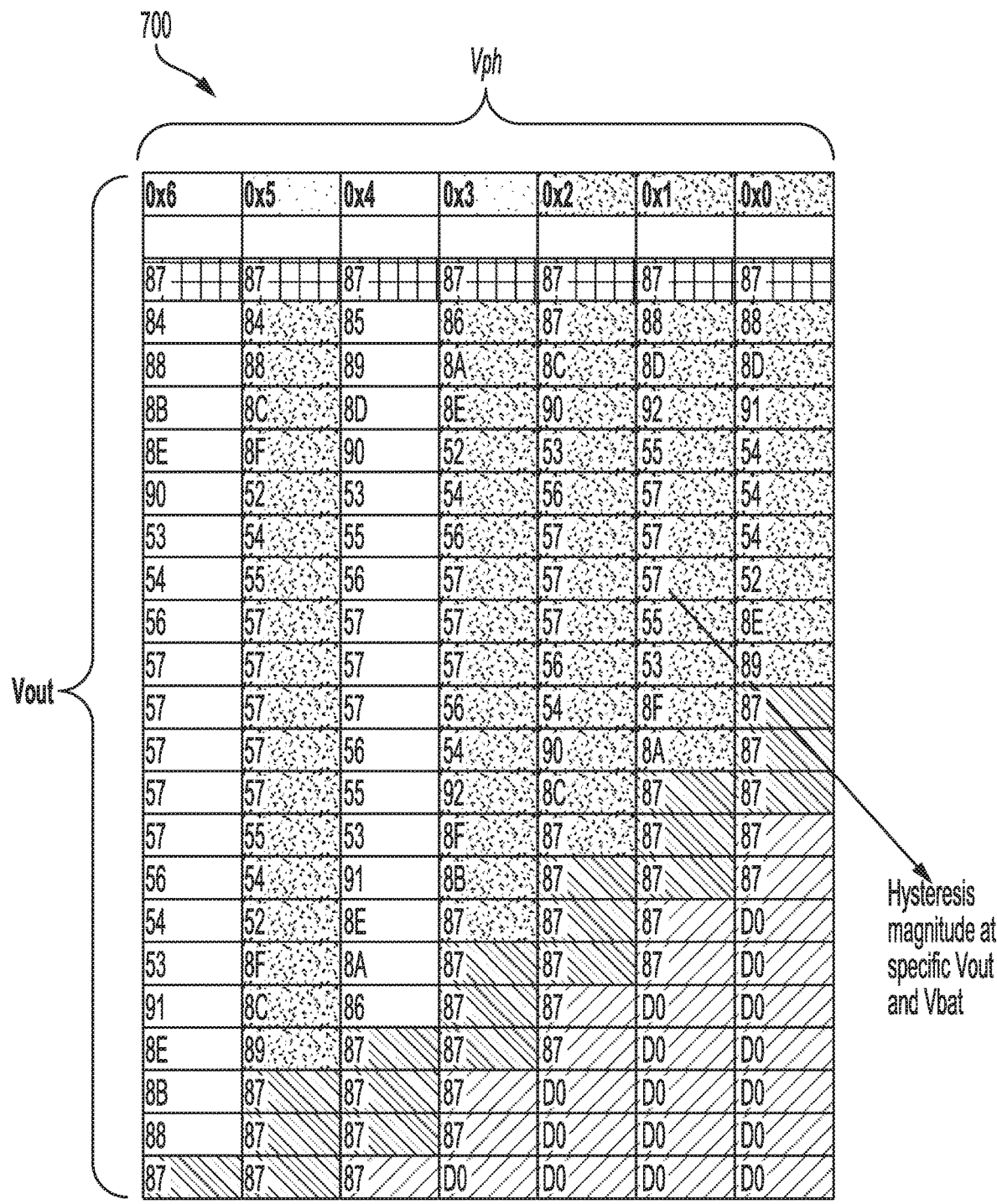
FIG. 7 illustrates a lookup table (LUT) to obtain hysteresis parameters at specific output voltages and battery voltages of a tri-level hysteretic switching regulator, according to aspects of the present disclosure.

FIG. 7 illustrates a lookup table (LUT) 700 to obtain hysteresis parameters at specific output voltages and battery voltages of the tri-level hysteretic switching regulator 400A, according to aspects of the present disclosure. In one aspect, the hysteresis generation device 425 determines current battery voltage Vph and output voltage Vout of the tri-level switching regulator 400A. Based on the current battery voltage Vph and the output voltage Vout, the hysteresis generation device 425 provides a hysteresis parameter. The hysteresis parameter may include the hysteresis voltage Vhyst.

The tri-level hysteretic switching regulator 400A may include the lookup table 700 or have access to the lookup table 700. The lookup table 700 includes optimized (or desirable) parameter settings that are stored in memory. For example, the lookup table 700 includes rows corresponding to various optimized output voltages Vout that are pre-defined and columns corresponding to various optimized battery voltages Vph that are pre-defined. For example, a hysteresis magnitude of 57 that corresponds to a specific hysteresis parameter may be selected for a current output voltage Vout and a current battery voltage Vph of the tri-level hysteretic switching regulator 400A. The specific hysteresis parameter may then be used to dynamically adjust the first hysteretic window of the first hysteretic comparator 405 associated with the first switching state and/or the second hysteretic window of the second hysteretic comparator 407 associated with the second switching state. The lookup table 700 may be stored in memory (e.g., the memory 282 of FIG. 2).

Figure 8:
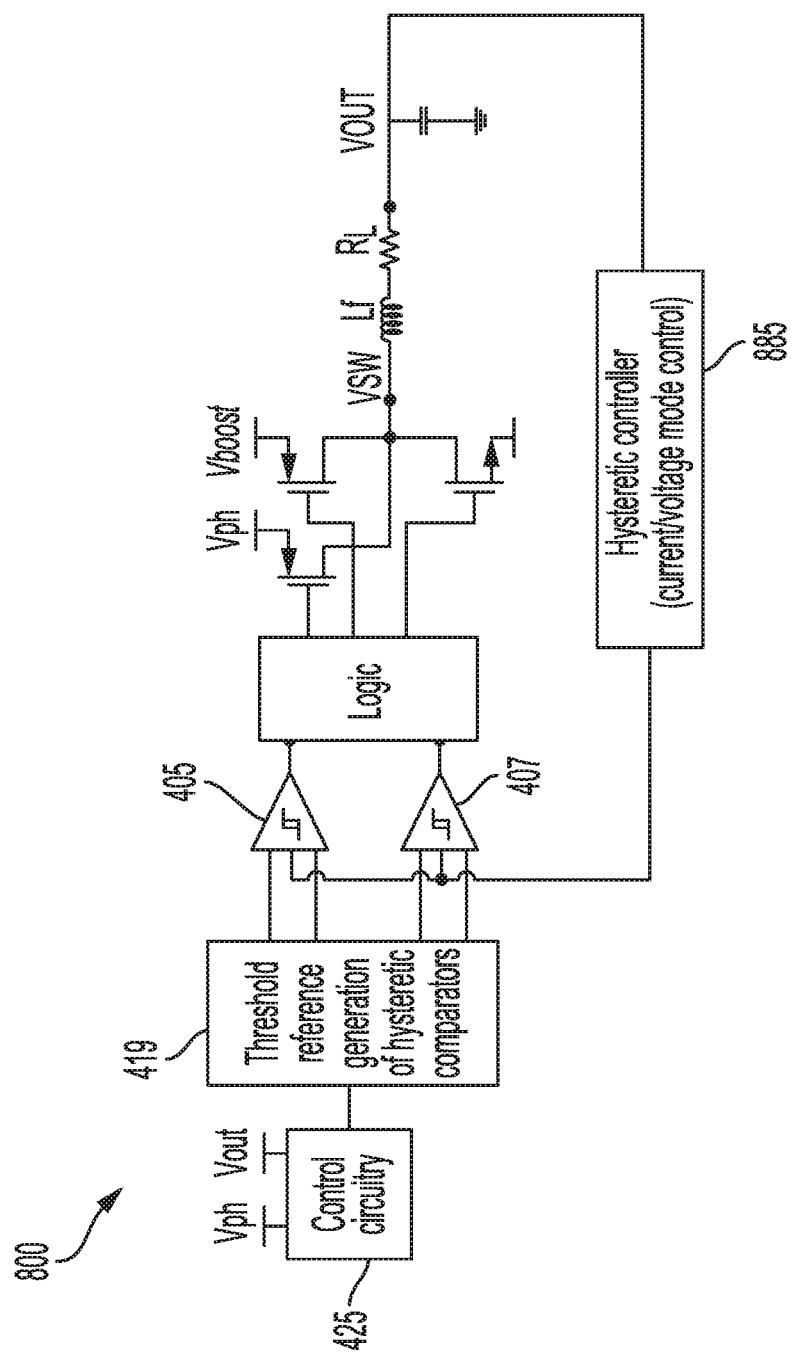
FIG. 8 is a schematic diagram of a tri-level hysteretic switching regulator including a feedback control loop, according to aspects of the present disclosure.

FIG. 8 is a schematic diagram of a tri-level hysteretic switching regulator 800 including a feedback control loop, according to aspects of the present disclosure. For illustrative purposes, some of the labelling and numbering of the devices and features of FIG. 8 are similar to those of FIG. 4A. The tri-level hysteretic switching regulator 800 includes a hysteretic control scheme block 885 (e.g., a hysteretic controller) for hysteretic control of the first hysteretic comparator 405 and the second hysteretic comparator 407.

Figure 9:
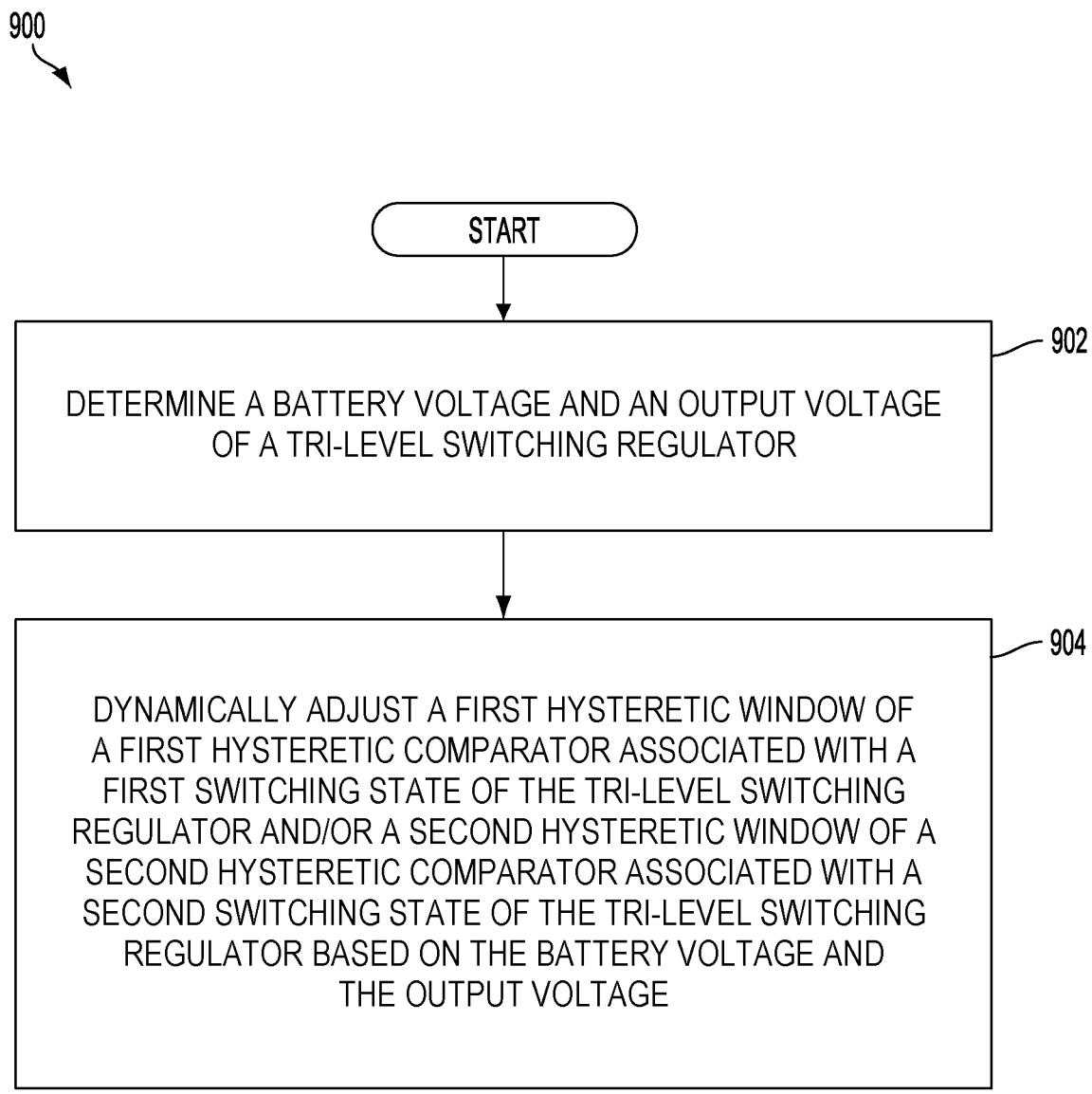
FIG. 9 depicts a simplified flowchart of a method for unbalancing a tri-level switching regulator using hysteretic control when switching across multiple states of the tri-level switching regulator, according to aspects of the present disclosure.

FIG. 9 depicts a simplified flowchart of a method 900 for unbalancing a tri-level switching regulator using hysteretic control when switching across multiple states of the tri-level switching regulator. At block 902, a controller (e.g., the hysteresis generation device 425) determines a battery voltage and an output voltage of the tri-level switching regulator. At block 904, the controller dynamically adjusts a first hysteretic window of a first hysteretic comparator associated with a first switching state of the tri-level switching regulator and/or a second hysteretic window of a second hysteretic comparator associated with a second switching state of the tri-level switching regulator based on the battery voltage and the output voltage.

According to one aspect of the present disclosure, a tri-level hysteretic switching regulator is described. The tri-level hysteretic switching regulator includes means for generating a threshold reference. The threshold reference generating means may, for example, be the threshold reference generation device 400D, the threshold reference generation device 419, the threshold reference generation device 500B, and/or the threshold reference generation device 600B. In another aspect, the aforementioned means may be any module or any apparatus or material configured to perform the functions recited by the aforementioned means.

Figure 10:
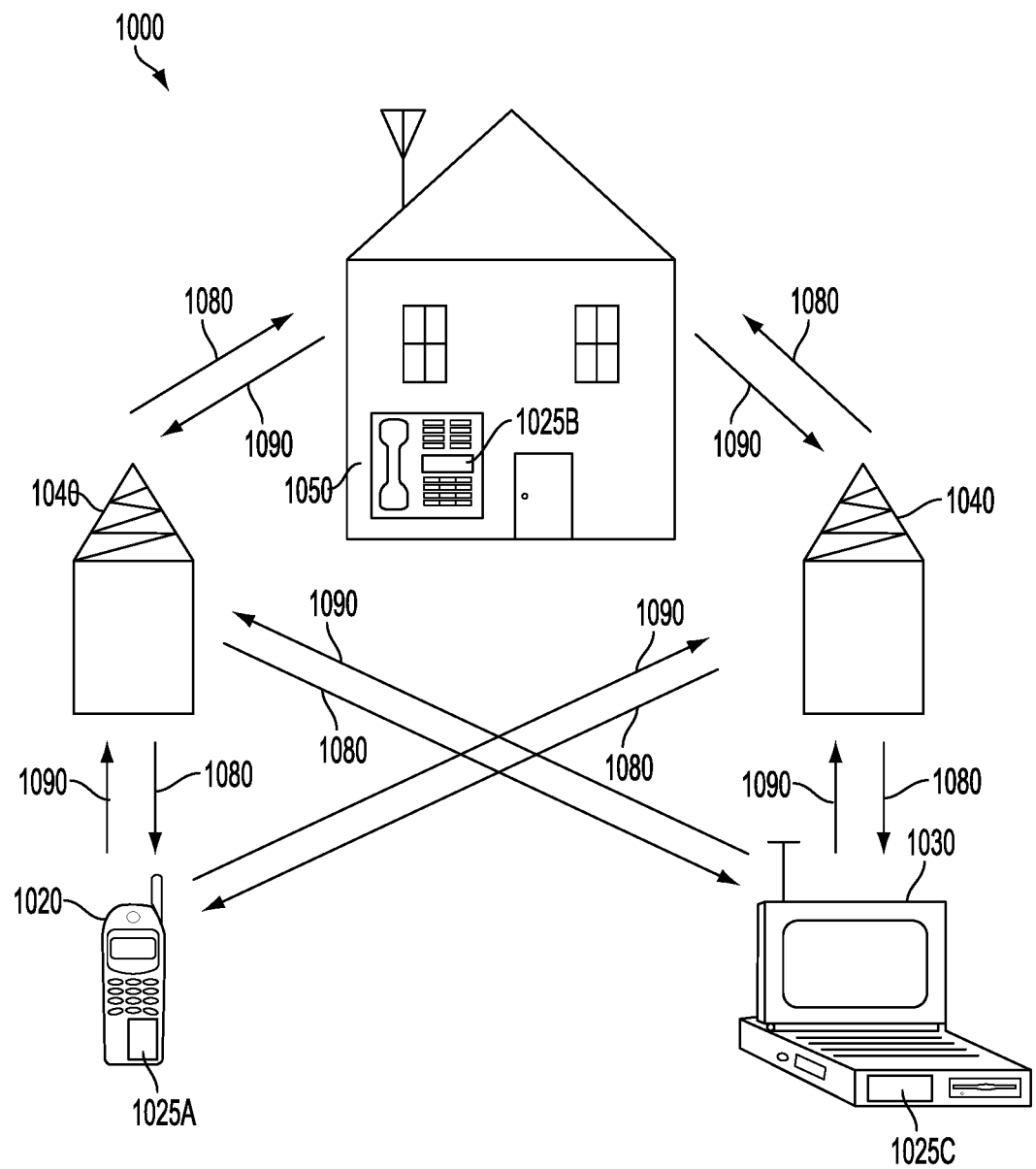
FIG. 10 is a block diagram showing an exemplary wireless communications system in which a configuration of the disclosure may be advantageously employed.

FIG. 10 is a block diagram showing an exemplary wireless communications system in which a configuration of the disclosure may be advantageously employed. For purposes of illustration, FIG. 10 shows three remote units 1020, 1030, and 1050 and two base stations 1040. It will be recognized that wireless communications systems may have many more remote units and base stations. Remote units 1020, 1030, and 1050 include IC devices 1025A, 1025B, and 1025C that include the disclosed tri-level hysteretic switching regulator. It will be recognized that other devices may also include the disclosed tri-level hysteretic switching regulator, such as the base stations, switching devices, and network equipment. FIG. 10 shows forward link signals 1080 from the base station 1040 to the remote units 1020, 1030, and 1050 and reverse link signals 1090 from the remote units 1020, 1030, and 1050 to base station 1040.

In FIG. 10, remote unit 1020 is shown as a mobile telephone, remote unit 1030 is shown as a portable computer, and remote unit 1050 is shown as a fixed location remote unit in a wireless local loop system. For example, a remote unit may be a mobile phone, a hand-held personal communications systems (PCS) unit, a portable data unit such as a personal digital assistant (PDA), a GPS enabled device, a navigation device, a set top box, a music player, a video player, an entertainment unit, a fixed location data unit such as a meter reading equipment, or other communications device that stores or retrieves data or computer instructions, or combinations thereof. Although FIG. 10 illustrates remote units according to the aspects of the disclosure, the disclosure is not limited to these exemplary illustrated units. Aspects of the disclosure may be suitably employed in many devices, which include the tri-level hysteretic switching regulator.

For a firmware and/or software implementation, the methodologies may be implemented with modules (e.g., procedures, functions, and so on) that perform the functions described herein. A machine-readable medium tangibly embodying instructions may be used in implementing the methodologies described herein. For example, software codes may be stored in a memory and executed by a processor unit. Memory may be implemented within the processor unit or external to the processor unit. As used herein, the term "memory" refers to types of long term, short term, volatile, nonvolatile, or other memory and is not to be limited to a particular type of memory or number of memories, or type of media upon which memory is stored.

If implemented in firmware and/or software, the functions may be stored as one or more instructions or code on a computer-readable medium. Examples include computer-readable media encoded with a data structure and computer-readable media encoded with a computer program. Computer-readable media includes physical computer storage media. A storage medium may be an available medium that can be accessed by a computer. By way of example, and not limitation, such computer-readable media can include RAM, ROM, EEPROM, CD-ROM or other optical disk storage, magnetic disk storage or other magnetic storage devices, or other medium that can be used to store desired program code in the form of instructions or data structures and that can be accessed by a computer; disk and disc, as used herein, includes compact disc (CD), laser disc, optical disc, digital versatile disc (DVD), floppy disk and Blu-ray disc where disks usually reproduce data magnetically, while discs reproduce data optically with lasers. Combinations of the above should also be included within the scope of computer-readable media.

In addition to storage on computer-readable medium, instructions and/or data may be provided as signals on transmission media included in a communications apparatus. For example, a communications apparatus may include a transceiver having signals indicative of instructions and data. The instructions and data are configured to cause one or more processors to implement the functions outlined in the claims.

The various illustrative logical blocks, modules, and circuits described in connection with the disclosure herein may be implemented or performed with a general-purpose processor, a digital signal processor (DSP), an application specific integrated circuit (ASIC), a field programmable gate array (FPGA) or other programmable logic device, discrete gate or transistor logic, discrete hardware components, or any combination thereof designed to perform the functions described herein. A general-purpose processor may be a microprocessor, but in the alternative, the processor may be any conventional processor, controller, microcontroller, or state machine. A processor may also be implemented as a combination of computing devices, e.g., a combination of a DSP and a microprocessor, multiple microprocessors, one or more microprocessors in conjunction with a DSP core, or any other such configuration.

Although the present disclosure and its advantages have been described in detail, it should be understood that various changes, substitutions, and alterations can be made herein without departing from the technology of the disclosure as defined by the appended claims. For example, relational terms, such as "above" and "below" are used with respect to a substrate or electronic device. Of course, if the substrate or electronic device is inverted, above becomes below, and vice versa. Additionally, if oriented sideways, above and below may refer to sides of a substrate or electronic device. Moreover, the scope of the present application is not intended to be limited to the particular configurations of the process, machine, manufacture, and composition of matter, means, methods, and steps described in the specification. As one of ordinary skill in the art will readily appreciate from the disclosure, processes, machines, manufacture, compositions of matter, means, methods, or steps, presently existing or later to be developed that perform substantially the same function or achieve substantially the same result as the corresponding configurations described herein may be utilized according to the present disclosure. Accordingly, the appended claims are intended to include within their scope such processes, machines, manufacture, compositions of matter, means, methods, or steps.

What is claimed is:

1. A tri-level hysteretic switching regulator comprising:
    a first hysteretic comparator;
    a second hysteretic comparator, the first hysteretic comparator and the second hysteretic comparator coupled to a high-side transistor, a mid-side transistor, and a low-side transistor and configured to control the high-side transistor, the mid-side transistor, and the low-side transistor; and
    a threshold reference generation device coupled to inputs of the first hysteretic comparator and the second hysteretic comparator, the threshold reference generation device configured to adjust at least one hysteresis threshold voltage of the first hysteretic comparator and the second hysteretic comparator.

2. The tri-level hysteretic switching regulator of claim 1, further comprising a hysteresis generation device coupled to the threshold reference generation device, the hysteresis generation device configured to generate hysteresis parameters to cause the threshold reference generation device to adjust at least one of a first hysteretic window of the first hysteretic comparator and a second hysteretic window of the second hysteretic comparator based on a battery voltage and an output voltage of the tri-level hysteretic switching regulator.

3. The tri-level hysteretic switching regulator of claim 2, further comprising a lookup table of pre-defined battery voltages and pre-defined output voltages that are matched with different hysteretic parameters, in which the hysteresis generation device is configured to select a hysteresis parameter corresponding to a current battery voltage and a current output voltage from a lookup table.

4. The tri-level hysteretic switching regulator of claim 2, in which the hysteresis parameters comprise a hysteresis voltage Vhyst or a hysteresis current Ihyst.

5. The tri-level hysteretic switching regulator of claim 1, in which the first hysteretic comparator is configured for low-side switching and the second hysteretic comparator is configured for high-side switching.

6. The tri-level hysteretic switching regulator of claim 1, in which the threshold reference generation device comprises variable resistors.

7. A method for unbalancing a tri-level switching regulator using hysteretic control when switching across multiple states of the tri-level switching regulator, the method comprising:

determining a battery voltage and an output voltage of the tri-level switching regulator; and dynamically adjusting at least one of a first hysteretic window of a first hysteretic comparator associated with a second switching state of the tri-level switching regulator and a second hysteretic window of a second hysteretic comparator associated with a first switching state of the tri-level switching regulator based on the battery voltage and the output voltage.

8. The method of claim 7, in which dynamically adjusting comprises dynamically increasing a second hysteresis threshold voltage of the first hysteretic window relative to a first hysteresis threshold voltage of the second hysteretic window when switching between power supply signals corresponding to the first switching state.

9. The method of claim 8, in which dynamically increasing the second hysteresis threshold voltage increases the first hysteretic window relative to the second hysteretic window.

10. The method of claim 8, in which dynamically adjusting further comprises dynamically increasing the second hysteresis threshold voltage and decreasing the first hysteresis threshold voltage when the output voltage is higher than the battery voltage and a difference between the battery voltage and the output voltage is less than a programmable threshold voltage.

11. The method of claim 8, in which switching between the power supply signals corresponding to the first switching state comprises switching between a battery supply signal and a boosted power supply signal in accordance with a high-side switching scheme.

12. The method of claim 8, in which dynamically adjusting further comprises dynamically reducing at least one of the first hysteresis threshold voltage and the second hysteresis threshold voltage after a time when the output voltage is approximately equal to the battery voltage.

13. The method of claim 7, in which dynamically adjusting comprises dynamically decreasing a second hysteresis threshold voltage of the first hysteretic window and dynamically increasing a first hysteresis threshold voltage of the second hysteretic window during low-side switching when the output voltage is lower than the battery voltage and a difference between the battery voltage and the output voltage is lower than a threshold.

14. The method of claim 7, in which dynamically adjusting comprises dynamically increasing a first hysteresis threshold voltage of the second hysteretic window relative to a second hysteresis threshold voltage of the first hysteretic window when switching between power supply signals corresponding to the second switching state.

15. The method of claim 14, in which switching between the power supply signals corresponding to the second switching state comprises switching between a battery supply signal and a ground signal in accordance with a low-side switching scheme.

16. The method of claim 7, in which dynamically adjusting comprises creating a voltage gap between the first hysteretic window of the first hysteretic comparator and the second hysteretic window of the second hysteretic comparator.

17. The method of claim 7, in which the dynamically adjusting at least one of the first hysteretic window and the second hysteretic window is based on a lookup table of pre-defined battery voltages and output voltages.

18. A tri-level hysteretic switching regulator comprising:
a first hysteretic comparator;
a second hysteretic comparator, the first hysteretic comparator and the second hysteretic comparator coupled to a high-side transistor, a mid-side transistor, and a low-side transistor and configured to control the high-side transistor, the mid-side transistor, and the low-side transistor; and
means for generating a threshold reference, the threshold reference generating means coupled to inputs of the first hysteretic comparator and the second hysteretic comparator, the threshold reference generating means configured to adjust at least one hysteresis threshold voltage of the first hysteretic comparator and the second hysteretic comparator.

19. The tri-level hysteretic switching regulator of claim 18, further comprising a hysteresis generation device coupled to the threshold reference generating means, the hysteresis generation device configured to generate hysteresis parameters to cause the threshold reference generating means to adjust a first hysteretic window of the first hysteretic comparator and/or a second hysteretic window of the second hysteretic comparator based on a battery voltage and an output voltage of the tri-level hysteretic switching regulator.

20. The tri-level hysteretic switching regulator of claim 19, further comprising a lookup table of pre-defined battery voltages and pre-defined output voltages that are matched with different hysteretic parameters, in which the hysteresis generation device is configured to select a hysteresis parameter corresponding to a current battery voltage and a current output voltage from a lookup table.

21. The tri-level hysteretic switching regulator of claim 19, in which the hysteresis parameters comprise a hysteresis voltage Vhyst or a hysteresis current Ihyst.

22. The tri-level hysteretic switching regulator of claim 18, in which the first hysteretic comparator is configured for low-side switching and the second hysteretic comparator is configured for high-side switching.

* * * * *